US009769406B2

(12) United States Patent
Sakano

(10) Patent No.: US 9,769,406 B2
(45) Date of Patent: Sep. 19, 2017

(54) SOLID-STATE IMAGE PICKUP DEVICE, DRIVING METHOD THEREOF, AND ELECTRONIC APPARATUS

(71) Applicant: SONY CORPORATION, Tokyo (JP)

(72) Inventor: Yorito Sakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/781,338

(22) PCT Filed: Mar. 26, 2014

(86) PCT No.: PCT/JP2014/001741
§ 371 (c)(1),
(2) Date: Sep. 30, 2015

(87) PCT Pub. No.: WO2014/167794
PCT Pub. Date: Oct. 16, 2014

(65) Prior Publication Data
US 2016/0044264 A1 Feb. 11, 2016

(30) Foreign Application Priority Data

Apr. 8, 2013 (JP) ................................. 2013-080487

(51) Int. Cl.
H04N 5/335 (2011.01)
H04N 5/228 (2006.01)
(Continued)

(52) U.S. Cl.
CPC ..... *H04N 5/3742* (2013.01); *H01L 27/14609* (2013.01); *H04N 5/361* (2013.01); *H04N 5/37452* (2013.01)

(58) Field of Classification Search
CPC ......... H01L 2924/00; H01L 2924/0002; H01L 2224/11; H01L 2224/0231; H01L 2224/03;
(Continued)

(56) References Cited

U.S. PATENT DOCUMENTS 5,841,126 A * 11/1998 Fossum ................ G11C 19/282
250/208.1
2007/0145447 A1 6/2007 Lee et al.
(Continued)

FOREIGN PATENT DOCUMENTS

JP 2005-328493 11/2005
JP 2006 245522 A 9/2006
(Continued)

OTHER PUBLICATIONS

International Search Report and Written Opinion prepared by the European Patent Office on Jul. 3, 2014, for International Application No. PCT/JP2014/001741.

Primary Examiner — Trung Diep
(74) Attorney, Agent, or Firm — Sheridan Ross P.C.

(57) ABSTRACT

A photoelectric conversion element that generates charges according to a light quantity of incident light and accumulates the charges in the inside thereof, a transfer transistor (TRG) that transfers the charges accumulated by the photoelectric conversion element, a first charge voltage conversion section that converts the charges transferred by the transfer transistor (TRG) into a voltage, and a substrate electrode of a MOS capacitor (a region of a second charge voltage conversion section facing a gate electrode) that connects the first charge voltage conversion section via a connection transistor (FDG). The gate electrode of the MOS capacitor is applied with a voltage that is different in a read period of the voltage signal converted by the first charge voltage conversion section and in a period other than the
(Continued)

read period. The present disclosure can also be applied to a CMOS image sensor or the like.

14 Claims, 14 Drawing Sheets

(51) Int. Cl.
  *H04N 5/374* (2011.01)
  *H01L 27/146* (2006.01)
  *H04N 5/361* (2011.01)
  *H04N 5/3745* (2011.01)
(58) Field of Classification Search
  CPC ....... H01L 2924/13091; H01L 2924/14; H01L 24/78; H01L 27/10802; H01L 27/10814; H01L 27/10852; H01L 29/788; H01L 27/14609

USPC ....................................... 348/308; 250/208.1
  See application file for complete search history.

(56) References Cited

U.S. PATENT DOCUMENTS

| | | | |
|---|---|---|---|
| 2008/0179495 | A1 | 7/2008 | Shimizu et al. |
| 2009/0295973 | A1 | 12/2009 | Oshikubo et al. |
| 2012/0193692 | A1* | 8/2012 | Kawahito ......... H01L 27/14609 257/292 |
| 2014/0362268 | A1* | 12/2014 | Etoh .................... H04N 5/3696 348/306 |

FOREIGN PATENT DOCUMENTS

| | | |
|---|---|---|
| JP | 2006-262387 | 9/2006 |
| JP | 2009-505498 | 2/2009 |
| WO | WO 2007/139255 A1 | 12/2007 |

* cited by examiner

SOLID-STATE IMAGE PICKUP DEVICE, DRIVING METHOD THEREOF, AND ELECTRONIC APPARATUS

CROSS REFERENCE TO RELATED APPLICATIONS

This application is a national stage application under 35 U.S.C. 371 and claims the benefit of PCT Application No. PCT/JP2014/001741 having an international filing date of Mar. 26, 2014, which designated the United States, which PCT application claimed the benefit of Japanese Patent Application No. 2013-080487 filed Apr. 8, 2013, the disclosures of which are incorporated herein by reference in their entirety.

TECHNICAL FIELD

The present disclosure relates to a solid-state image pickup device, a driving method thereof, and an electronic apparatus, and particularly to, a solid-state image pickup device, a driving method thereof, and an electronic apparatus which are capable of suppressing the generation of a strong electric field in a place on a substrate in a period other than a read period.

CROSS REFERENCE TO RELATED APPLICATIONS

This application claims the benefit of Japanese Priority Patent Application JP 2013-080487 filed on Apr. 8, 2013, the entire contents of which are incorporated herein by reference.

BACKGROUND ART

A solid-state image pickup device, for example, is used in an image pickup apparatus such as a digital still camera and a video camera, and an electronic apparatus such as a portable terminal having an imaging function. As an example of the solid-state image pickup device, there is a complementary MOS (CMOS) image sensor which reads charges accumulated in a photodiode serving as a photoelectric conversion element via a metal oxide semiconductor (MOS) transistor.

Generally, the CMOS image sensor transfers the charges accumulated in the photodiode of each pixel to a charge voltage conversion section via a transfer transistor, and converts the charges into a voltage to read the signal.

In such a CMOS image sensor, there is a proposed configuration in which capacitance is added to the charge voltage conversion section via a transistor, and the capacitance of the charge voltage conversion section is configured to be variable. Specifically, there is a proposed configuration in which the charge voltage conversion section is divided into two parts, and a capacitor is added to one part (see, for example, PTLs 1 to 3).

With this configuration, the technology of PTL 1 can switch a gain for converting charges into a voltage, and realize an improvement in a fill factor. In addition, the technologies of PTLs 2 and 3 can accumulate charges generated by the photoelectric conversion element during an exposure period in the capacitor added to the charge voltage conversion section, so that it can make a dynamic range expand toward a high illumination region.

CITATION LIST

Patent Literature

PTL 1: JP 2009-505498A
PTL 2: JP 2005-328493A
PTL 3: JP 2006-262387A

SUMMARY OF INVENTION

Technical Problem

Incidentally, in the technology of PTL 1, a counter electrode of the charge voltage conversion section in the capacitor is connected to drains of a reset transistor and an amplification transistor, and a power source voltage is applied to the counter electrode.

However, when the power source voltage is typically applied between the electrodes of the capacitor, a strong electric field is generated in a place on the substrate, so that there is a cause for concern from the viewpoint of reliability.

The present disclosure has been made in view of the above circumstances, and can suppress the generation of a strong electric field in a place on the substrate in a period other than a read period.

Solution to Problem

According to a first aspect of the present disclosure, there is provided a solid-state image pickup device including: a photoelectric conversion element that generates charges according to a light quantity of incident light and accumulates the charges in the inside thereof; a charge transfer section that transfers the charges accumulated by the photoelectric conversion element; a charge voltage conversion section that converts the charges transferred by the charge transfer section into a voltage; and a MOS capacitor that connects the charge voltage conversion section and a substrate electrode via a transistor, wherein a gate electrode of the MOS capacitor is applied with a voltage that is different in a read period of the voltage signal converted by the charge voltage conversion section and in a period other than the read period.

A driving method and an electronic apparatus according to the first aspect of the present disclosure correspond to a solid-state image pickup device according to the first aspect of the present disclosure.

In the first aspect of the present disclosure, a photoelectric conversion element generates charges according to a light quantity of incident light and accumulates the charges in the inside thereof, a charge transfer section transfers the charges accumulated by the photoelectric conversion element, a charge voltage conversion section converts the charges transferred by the charge transfer section into a voltage, a substrate electrode of a MOS capacitor is connected to the charge voltage conversion section via a transistor, and a gate electrode of the MOS capacitor is applied with a voltage which is different in a read period of the voltage signal converted by the charge voltage conversion section and in a period other than the read period.

According to a second aspect of the present disclosure, there is provided an electronic apparatus including: a photoelectric conversion element that generates charges according to a light quantity of incident light and accumulates the charges in the inside thereof; a charge transfer section that transfers the charges accumulated by the photoelectric conversion element; a charge voltage conversion section that converts the charges transferred by the charge transfer section into a voltage; and a MOS capacitor that connects the charge voltage conversion section and a substrate electrode via a transistor, wherein the substrate electrode of the MOS capacitor is applied with a voltage that is different in a read period of the voltage signal converted by the charge voltage conversion section and in a period other than the read period.

A driving method and an electronic apparatus according to the second aspect of the present disclosure correspond to a solid-state image pickup device according to the second aspect of the present disclosure.

In the second aspect of the present disclosure, a photoelectric conversion element generates charges according to a light quantity of incident light and accumulates the charges in the inside thereof, a charge transfer section transfers the charges accumulated by the photoelectric conversion element, a charge voltage conversion section converts the charges transferred by the charge transfer section into a voltage, a substrate electrode of a MOS capacitor is connected to the charge voltage conversion section via a transistor, and the substrate electrode of the MOS capacitor is applied with a voltage which is different in a read period of the voltage signal converted by the charge voltage conversion section and in a period other than the read period.

Advantageous Effects of Invention

According to the present disclosure, it is possible to suppress that a strong electric field is generated in a place on a substrate in a period other than a read period.

DESCRIPTION OF EMBODIMENTS

<Assumption of Present Disclosure>

As the configuration of a pixel in a CMOS image sensor in which a charge voltage conversion section is divided into two parts and a MOS capacitor is added to one part, there are mainly two kinds of configurations.

A first configuration is a configuration in which a substrate is used as a counter electrode of the charge voltage conversion section in the MOS capacitor. A second configuration is a configuration in which a gate electrode is used as the counter electrode of the charge voltage conversion section in the MOS capacitor.

Figure 1:
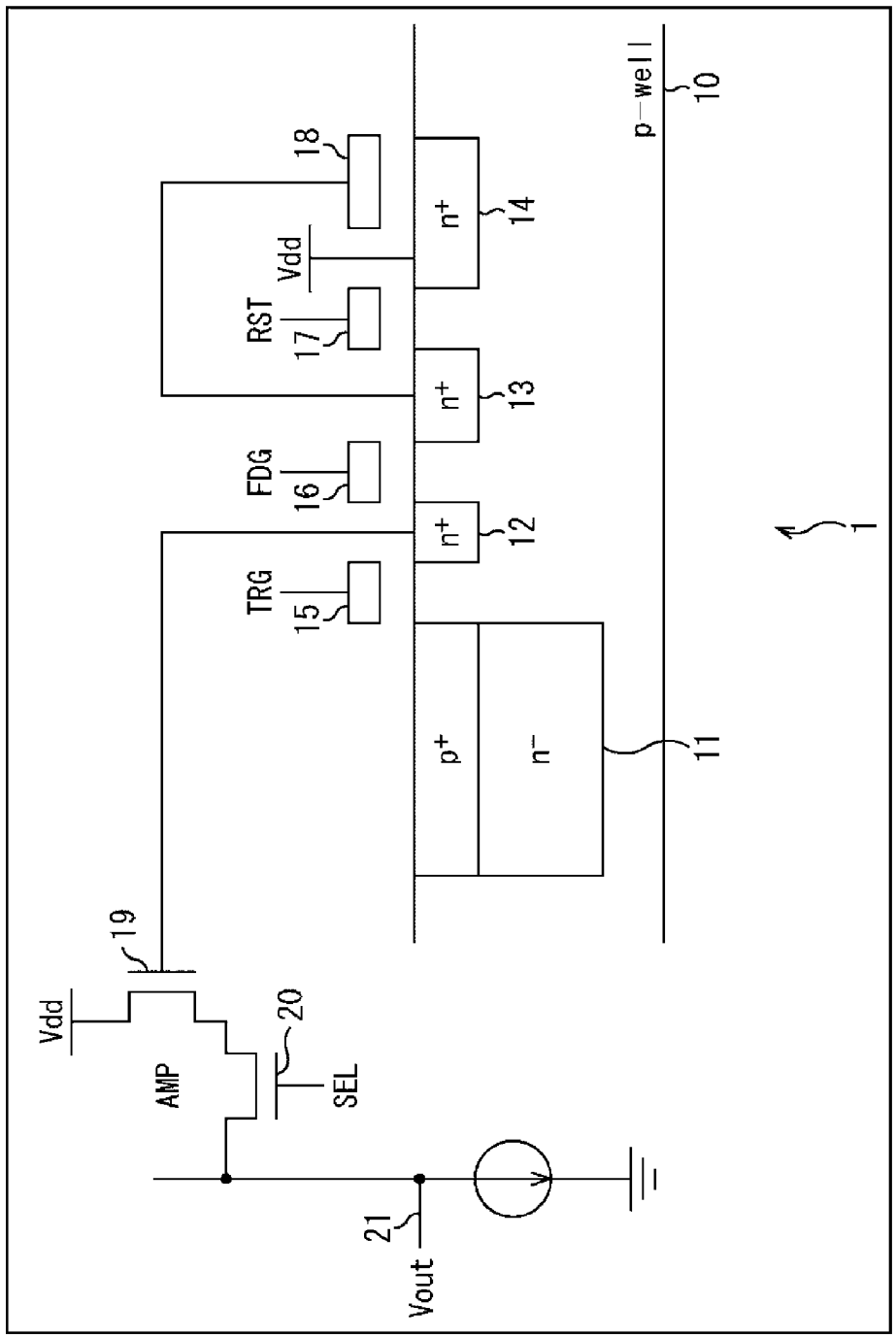
FIG. 1 is a cross-sectional view illustrating an example of a first configuration of a pixel.

FIG. 1 is a cross-sectional view illustrating an example of the first configuration of the pixel.

As illustrated in FIG. 1, a first charge voltage conversion section (FD1) 12 which is configured by a photoelectric conversion element (HAD) 11 and an n-type layer (n+) is provided in a substrates 10 in which a p-well layer is formed. The photoelectric conversion element 11 is formed such that a p-type layer (p+) and an n-type layer (n−) are sequentially disposed from the substrate surface side, generates charges of which the amount corresponds to a light quantity of incident light, and accumulates the charges in the inside thereof. The first charge voltage conversion section 12 converts the charges transferred from the photoelectric conversion element 11 into a voltage.

In addition, the substrate 10 is provided with a second charge voltage conversion section (FD2) 13 which is configured by the n-type layer (n+), and an n-type layer (n+) 14 which serves as a counter electrode of the second charge voltage conversion section 13 in the MOS capacitor and is supplied with a power source voltage (Vdd). The second charge voltage conversion section 13 converts the charges transferred from the photoelectric conversion element 11 into a voltage in cooperation with the first charge voltage conversion section 12.

Furthermore, in the upper portion of the substrate 10 between the photoelectric conversion element 11 and the first charge voltage conversion section 12, a gate electrode 15 is provided via a gate insulating film (not illustrated). The photoelectric conversion element 11, the first charge voltage conversion section 12, and the gate electrode 15 serve as a transfer transistor (TRG) which transfers the charges from the photoelectric conversion element 11 to the first charge voltage conversion section 12.

In the upper portion of the substrate 10 between the first charge voltage conversion section 12 and the second charge voltage conversion section 13, a gate electrode 16 is provided via a gate insulating film (not illustrated). The first charge voltage conversion section 12, the second charge voltage conversion section 13, and the gate electrode 16 serve as a connection transistor (FDG) which electrically connects the first charge voltage conversion section 12 and the second charge voltage conversion section 13.

In addition, in the upper portion of the substrate 10 between the second charge voltage conversion section 13 and the n-type layer 14, a gate electrode 17 is provided via a gate insulating film (not illustrated). The second charge voltage conversion section 13, the n-type layer 14, and the gate electrode 17 serve as a reset transistor (RST) which resets charges of the second charge voltage conversion section 13 and the first charge voltage conversion section 12 using the charges of the n-type layer 14.

In addition, in the upper portion of the n-type layer 14, a gate electrode 18 as an electrode of the second charge voltage conversion section 13 in the MOS capacitor is provided via a gate insulating film (not illustrated), and the gate electrode 18 is connected to the second charge voltage conversion section 13. The gate electrode 18 and the n-type layer 14 serve as the MOS capacitor.

The source of an amplification transistor (AMP) 19 of which the gate is connected to the first charge voltage conversion section 12 so as to amplify the voltage converted by the first charge voltage conversion section 12 is connected to a drain of a read transistor (SEL) 20 which makes a control of reading a pixel signal. The power source voltage is applied to the drain of the amplification transistor 19. The source of the read transistor 20 is connected to a read line 21, and the voltage signal amplified by the amplification transistor 19 is output as the pixel signal to the read line 21 via the read transistor 20. The read transistor 20 makes a control of reading the pixel signal.

With the configuration described above, in a pixel 1 of FIG. 1, no power source voltage is applied between the gate electrode 18 and the n-type layer 14 except during a read period and the irradiation of a large light quantity. However, the second charge voltage conversion section 13 is necessarily provided with a contact region in order to connect the gate electrode 18 and the second charge voltage conversion section 13. For this reason, the second charge voltage conversion section 13 is increased in area, and thus area efficiency is reduced.

Figure 2:
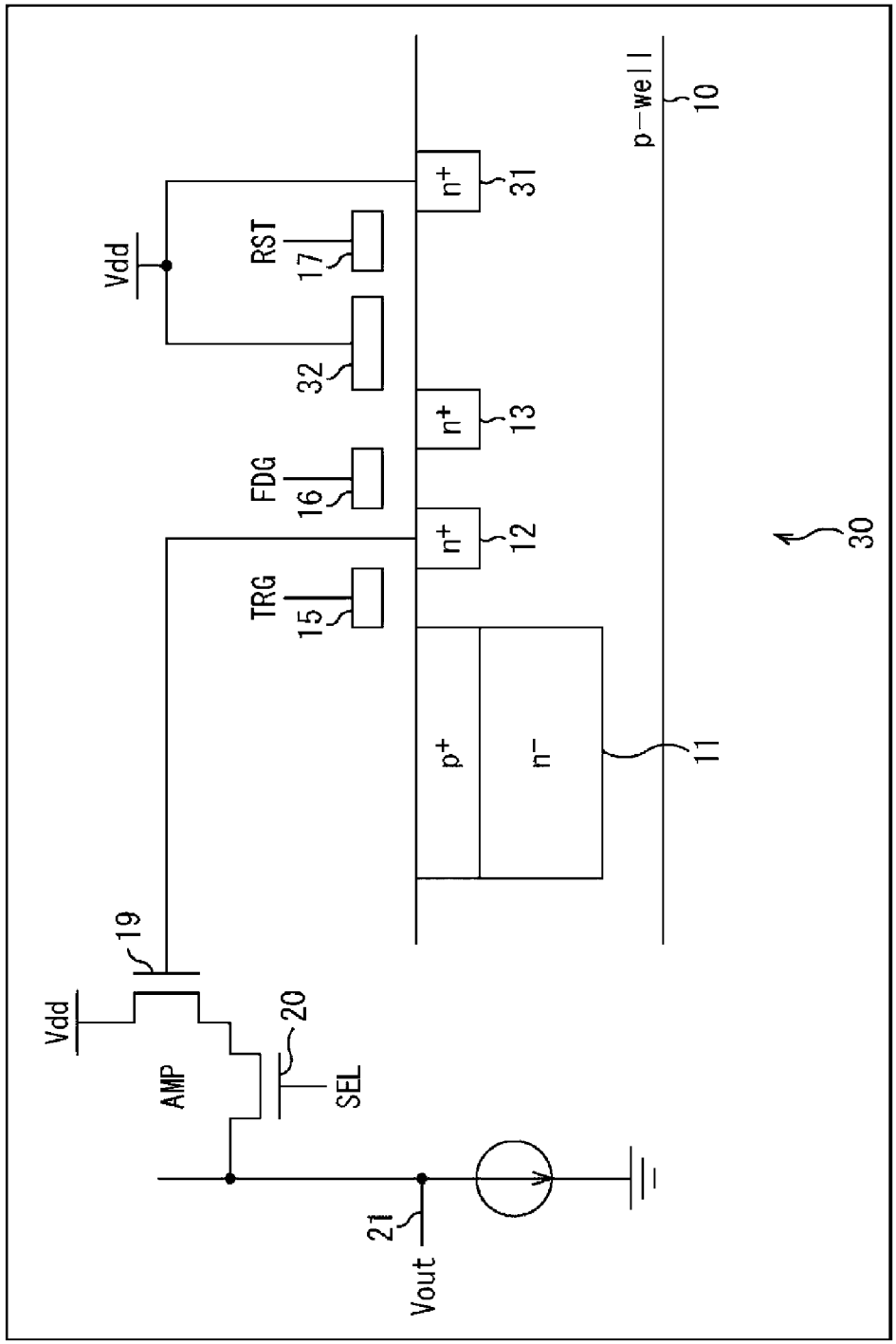
FIG. 2 is a cross-sectional view illustrating an example of a second configuration of the pixel.

FIG. 2 is a cross-sectional view illustrating an example of the second configuration of the pixel.

Among the configurations illustrated in FIG. 2, the same configurations as those of FIG. 1 are denoted with the same symbols. A redundant description will not be repeated appropriately.

The configuration of a pixel 30 illustrated in FIG. 2 is different from that of the pixel 1 illustrated in FIG. 1 in that an n-type layer 31 and a gate electrode 32 are provided instead of the n-type layer 14 and the gate electrode 18. In the pixel 30 illustrated in FIG. 2, the gate electrode 32 is used as the counter electrode of the second charge voltage conversion section 13 in the MOS capacitor.

Specifically, the n-type layer 31 to which the power source voltage is applied is provided in the substrate 10. In addition, in the upper portion of the substrate 10 between the second charge voltage conversion section 13 and the n-type layer 31, the gate electrode 32 is provided to be adjacent to the second charge voltage conversion section 13, serving as the counter electrode of the second charge voltage conversion section 13 in the MOS capacitor. Therefore, the electrode of the second charge voltage conversion section 13 in the MOS capacitor is the substrate 10 which faces the gate electrode 32. The gate electrode 32 is connected to the n-type layer 31, and the power source voltage is applied thereto.

With the configuration described above, since there is no need to make the n-type layer 31 face the gate electrode 18 in the pixel 30 illustrated in FIG. 2, the n-type layer 31 can be made small compared to the n-type layer 14 illustrated in FIG. 1. Therefore, the pixel 30 has a high area efficiency compared to the pixel 1. Accordingly, the pixel 30 illustrated in FIG. 2 is desirable when the improvement of the fill factor is aimed at as in the case of the technology in PTL 1.

However, the pixel 30 is typically in a state in which the power source voltage is applied between the gate electrode 32 and the substrate 10. For this reason, even in a case other than the read period and the irradiation of a large light quantity, a strong electric field is typically generated in the substrate 10, and thus there is a cause for concern from the view point of reliability. Specifically, an adverse influence is caused on the imaging characteristics such as white spots and dark current under a dark atmosphere.

Therefore, according to the present disclosure, in a pixel like the pixel 30 in which the gate electrode is used as the counter electrode of the second charge voltage conversion section in the MOS capacitor, a voltage applied to the gate electrode or a substrate electrode of the MOS capacitor is changed different between the read period and a period other than the read period. With this configuration, it is possible to suppress that a strong electric field is generated in a place on the substrate in the period other than the read period. As a result, the reliability can be improved while the area efficiency is maintained.

Figure 3:
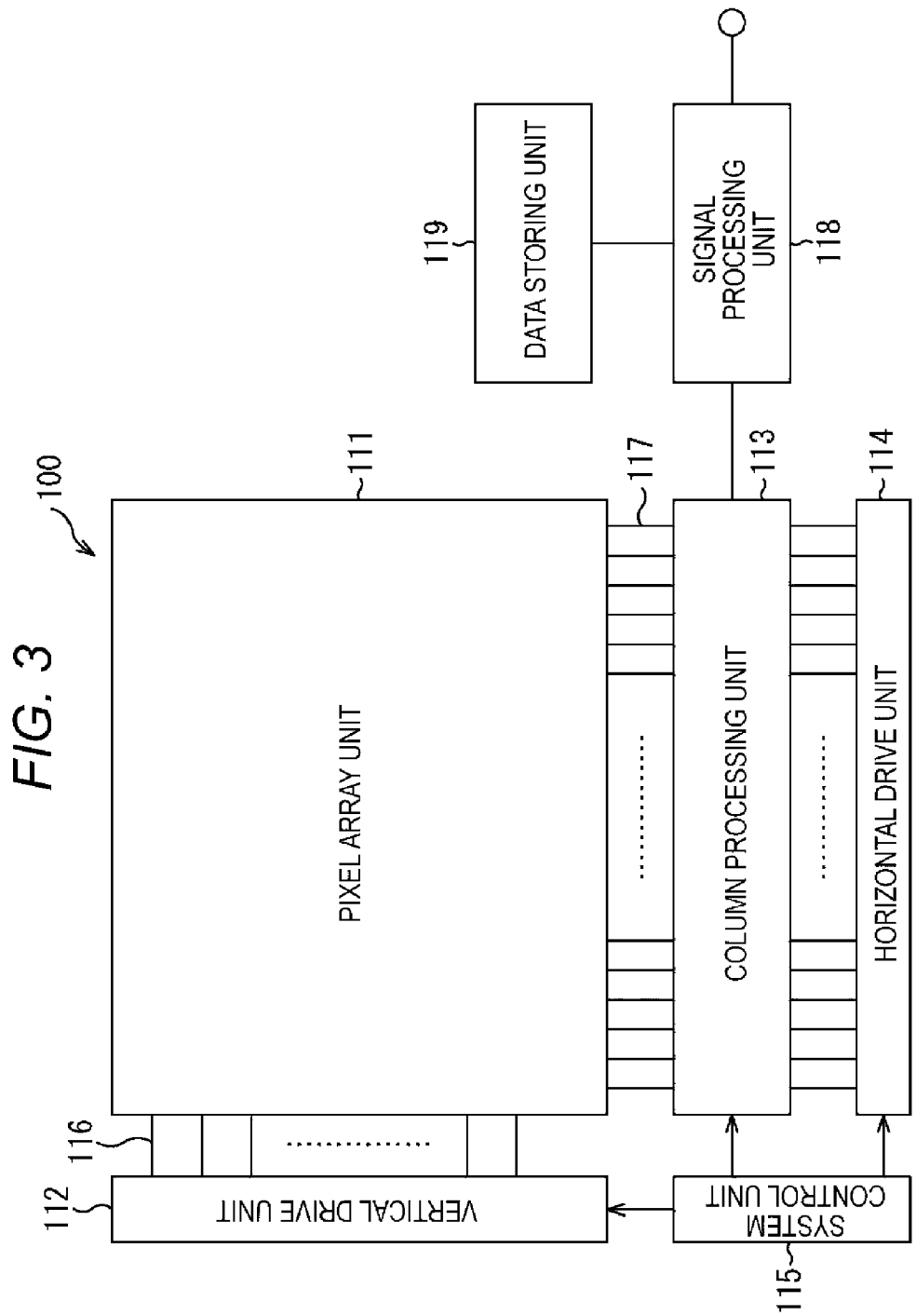
FIG. 3 is a block diagram illustrating an example of the configuration according to a first embodiment of a CMOS image sensor as a solid-state image pickup device to which the present disclosure is applied.

<First Embodiment>
Example of Configuration of Solid-State Image Pickup Device according to First Embodiment FIG. 3 is a block diagram illustrating an example of the configuration according to a first embodiment of a CMOS image sensor as a solid-state image pickup device to which the present disclosure is applied.

A CMOS image sensor 100 is configured by a pixel array unit 111, a vertical drive unit 112, a column processing unit 113, a horizontal drive unit 114, a system control unit 115, pixel drive lines 116, vertical signal lines 117, a signal processing unit 118, and a data storing unit 119.

The pixel array unit 111, the vertical drive unit 112, the column processing unit 113, the horizontal drive unit 114, the system control unit 115, the pixel drive lines 116, the vertical signal lines 117, the signal processing unit 118, and the data storing unit 119 are formed in a substrate (chip) which is not illustrated.

Further, the CMOS image sensor 100 may not include the signal processing unit 118 and the data storing unit 119. For example, the signal processing unit 118 and the data storing unit 119 may be provided as an external signal processing unit such as a digital signal processor (DSP) in a substrate separate from the CMOS image sensor 100.

The CMOS image sensor 100 picks up an image of an object, and outputs pixel signals of the respective pixels of the image.

Specifically, in the pixel array unit 111, pixels are two-dimensionally disposed in a matrix form, and each of them includes a photoelectric conversion element generating charges of which the amount corresponds to the light quantity of incident light, and accumulates the charges in the inside thereof.

In addition, in the pixel array unit 111, the pixel drive line 116 is formed for each row of the pixels in the matrix form in a horizontal direction (a row direction) of the drawing, and the vertical signal line 117 is formed for each column in a vertical direction (a column direction) of the drawing. One end of the pixel drive line 116 is connected to an output terminal (not illustrated) which corresponds to each row of the vertical drive unit 112.

The vertical drive unit 112 is a pixel drive unit which is configured by a shift register, an address decoder, and the like, and drives the respective pixels of the pixel array unit 111 in units of rows. Although a detailed configuration of the vertical drive unit 112 is not illustrated, the vertical drive unit 112 is configured to include two scanning systems, that is, a read scanning system and a sweeping-out scanning system.

The read scanning system sequentially selects each row so as to sequentially read the pixel signals from the respective pixels in units of rows, and outputs a selection pulse and the like from the output terminal connected to the pixel drive line 116 of the selected row.

The sweeping-out scanning system outputs a control pulse from the output terminal connected to the pixel drive line 116 of each row at a time earlier by an amount of time corresponding to a shutter speed than a time at which the scanning operation of the read scanning system is performed, in order to sweep out (reset) unnecessary charges from the photoelectric conversion element. A so-called electronic shutter operation is sequentially performed on the respective rows by the scanning operation of the sweeping-out scanning system. Here, the electronic shutter operation is an operation in which charges are drained from the photoelectric conversion element and an exposure operation newly starts (accumulation of charges starts).

The pixel signals which are output from the respective pixels of each row selected by the read scanning system of the vertical drive unit 112 pass through the respective vertical signal lines 117 and are supplied to the column processing unit 113.

The column processing unit 113 includes a signal processing circuit for each column of the pixel array unit 111. Each signal processing circuit of the column processing unit 113 performs noise removal processing such as a correlated double sampling (CDS) process and signal processing such as an A/D conversion process on the pixel signal output from each pixel of the selected row through the vertical signal line 117. In the CDS process, fixed pattern noise, which is unique to each pixel, such as reset noise and variation in the threshold value of the amplification transistor is removed. The column processing unit 113 temporarily holds the pixel signals which have been subjected to the signal processing.

The horizontal drive unit 114 is configured by a shift register, an address decoder, and the like, and sequentially selects the signal processing circuits of the column processing unit 113. In a selection scanning operation of the horizontal drive unit 114, the pixel signals subjected to the signal processing by the respective signal processing circuits of the column processing unit 113 are sequentially output to the signal processing unit 118.

The system control unit 115 is configured by a timing generator which generates various types of timing signals and the like, and makes a control of driving the vertical drive unit 112, the column processing unit 113, and the horizontal drive unit 114 based on the various types of timing signals generated by the timing generator.

The signal processing unit 118 has at least an addition processing function. The signal processing unit 118 performs various types of signal processing such as addition processing on the pixel signals output from the column processing unit 113. At this time, the signal processing unit 118, if necessary, stores intermediate results and the like obtained from the signal processing in the data storing unit 119, which will be referred to at a necessary timing. The signal processing unit 118 outputs the pixel signals which have been subjected to the signal processing.

(Example of Configuration of Pixel)

Figure 4:
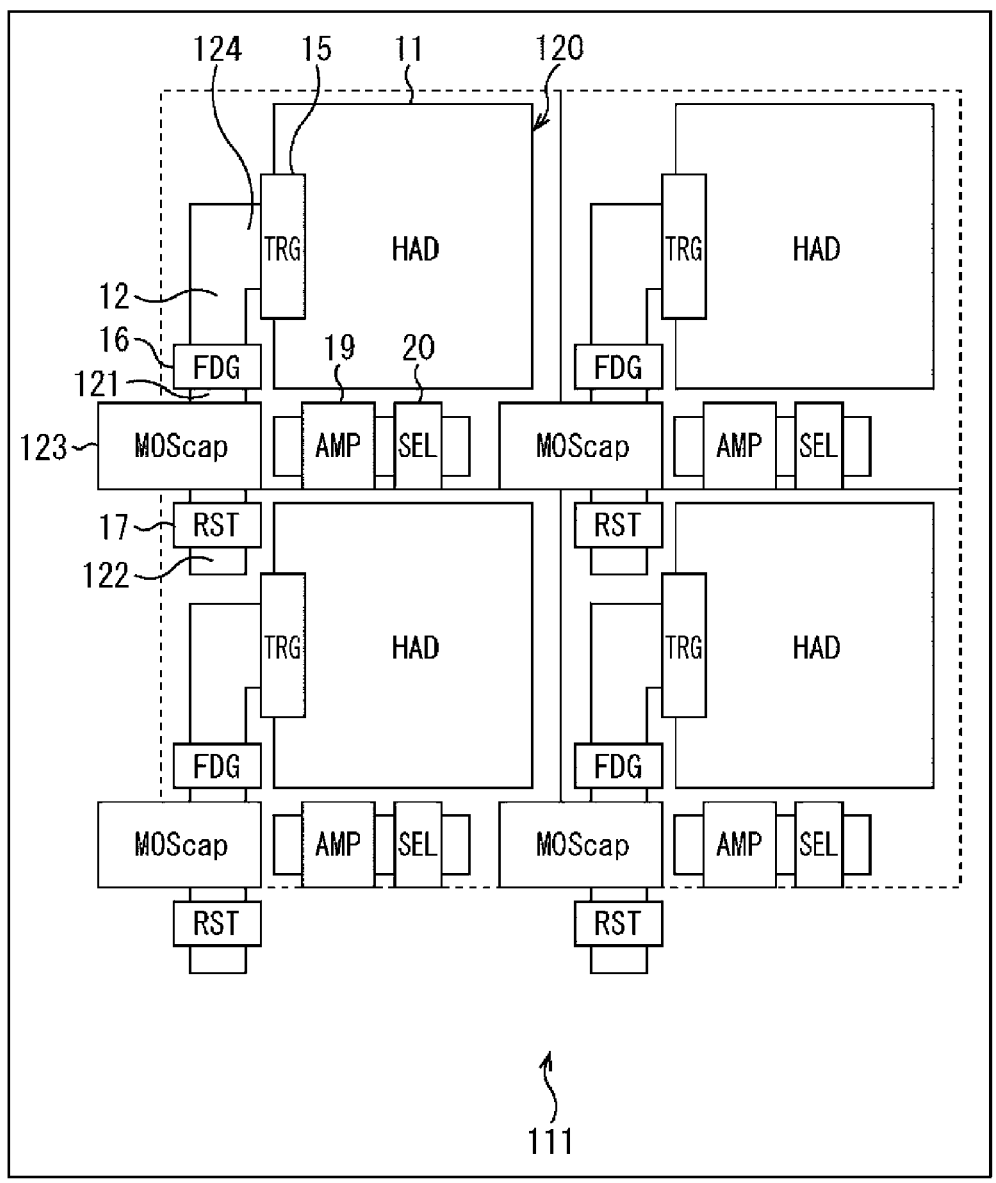
FIG. 4 is a plan view illustrating an example of the configuration of a pixel in a pixel array unit of FIG. 3.
Figure 5:
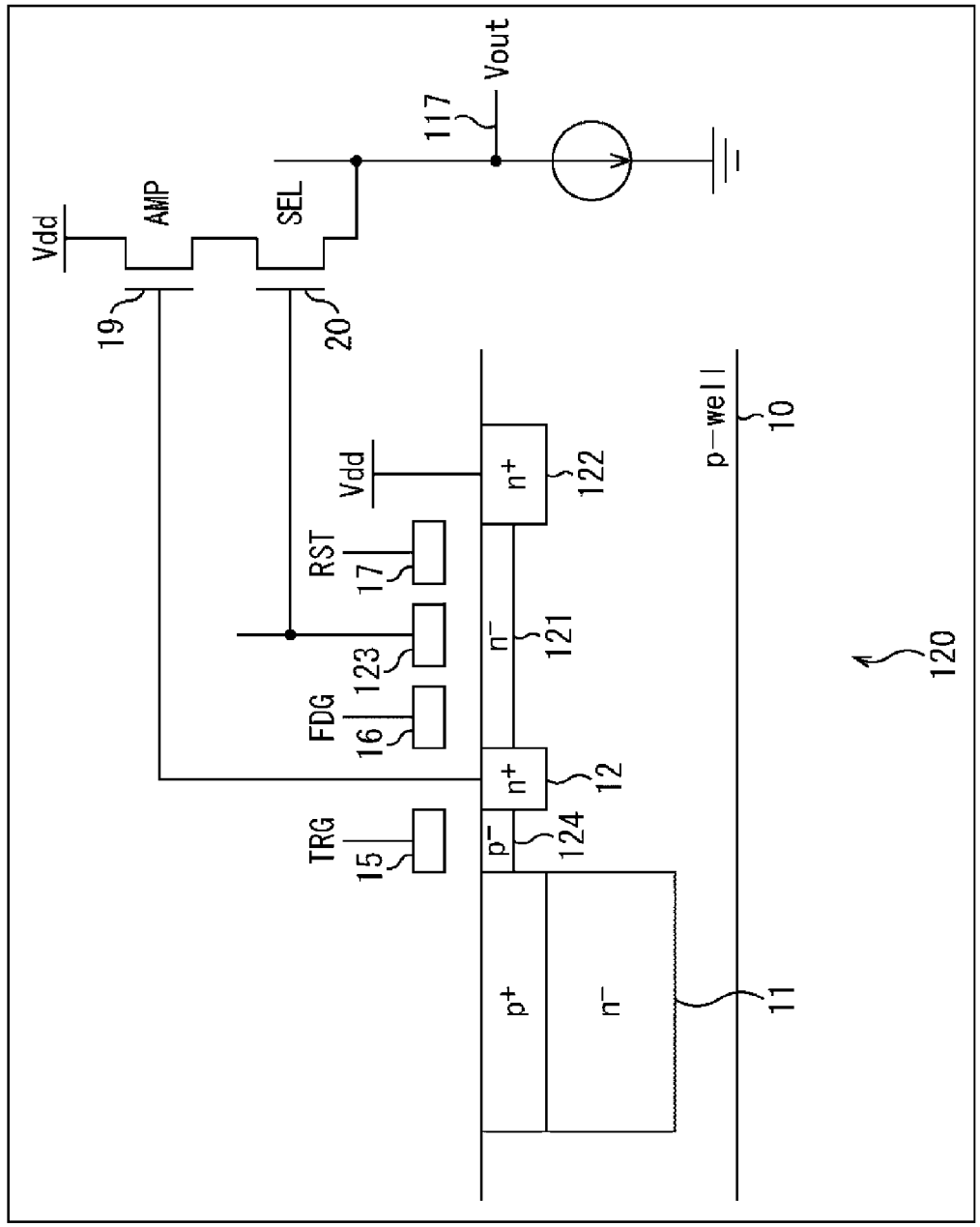
FIG. 5 is a cross-sectional view illustrating the example of the configuration of the pixel in the pixel array unit of FIG. 3.

FIGS. 4 and 5 are a plan view and a cross-sectional view which illustrate an example of the configuration of the pixel in the pixel array unit 111 of FIG. 3, respectively.

Further, in FIG. 4, only 2*2 pixels disposed in the pixel array unit 111 are illustrated to help the explanation for convenience sake. This will be the same also in FIG. 8 to be described below.

Among the configurations illustrated in FIGS. 4 and 5, the same configurations as those of FIG. 2 are denoted with the same symbols. A redundant description will not be repeated appropriately.

The configuration of a pixel 120 illustrated in FIGS. 4 and 5 is different from that of the pixel 30 illustrated in FIG. 2 in that a second charge voltage conversion section 121, an n-type layer 122, and a gate electrode 123 are provided instead of the second charge voltage conversion section 13, the n-type layer 31, and the gate electrode 32. In the pixel 120, the gate electrode 123 which is connected to the gate of the read transistor 20 is used as a counter electrode of the second charge voltage conversion section 121 in the MOS capacitor.

Specifically, as illustrated in FIGS. 4 and 5, the second charge voltage conversion section (FC) 121 which is configured by the n-type layer (n−) is provided in the pixel 120 to be adjacent to the first charge voltage conversion section 12 inside the substrate 10. In addition, an n-type layer (n+) 122 to which the power source voltage is applied is provided inside the substrate 10 to interpose the second charge voltage conversion section 121 in cooperation with the first charge voltage conversion section 12.

In addition, in the upper portion of the second charge voltage conversion section 121 of the substrate 10, the gate electrode 16, the gate electrode 123, and the gate electrode 17 are provided via a gate insulating film (not illustrated) sequentially from the first charge voltage conversion section 12 to completely cover the facing region thereof.

The first charge voltage conversion section 12, the gate electrode 16, and the second charge voltage conversion section 121 serve as the connection transistor (FDG) which electrically connects the first charge voltage conversion section 12 and the second charge voltage conversion section 121.

In addition, the gate electrode 123 and the region of the second charge voltage conversion section 121 facing the gate electrode 123 serve as the MOS capacitor. In other words, the gate electrode 123 is the gate electrode of the MOS capacitor, and the region of the second charge voltage conversion section 121 facing the gate electrode 123 is the substrate electrode of the MOS capacitor. The gate electrode 123 is connected to the gate of the read transistor 20, and the substrate electrode of the MOS capacitor is connected to the first charge voltage conversion section 12 via the connection transistor (FDG).

Furthermore, the second charge voltage conversion section 121, the n-type layer 122, and the gate electrode 17 serve as the reset transistor (RST) which resets the charges of the second charge voltage conversion section 121 and the first charge voltage conversion section 12 using the charges of the n-type layer 122.

Further, in the following, the region in the substrate 10 facing the gate electrode 15 will be referred to as a region 124.

With the configuration described above, in the pixel 120, since no gate electrodes are connected to the region facing the gate electrode 123 of the second charge voltage conversion section 121 and there is no need to provide the contact region, the pixel 120 has a high area efficiency compared to the pixel 1 illustrated in FIG. 1. Accordingly, it is possible to improve the fill factor.

(First Example of Operation of Pixel)

Figure 6:
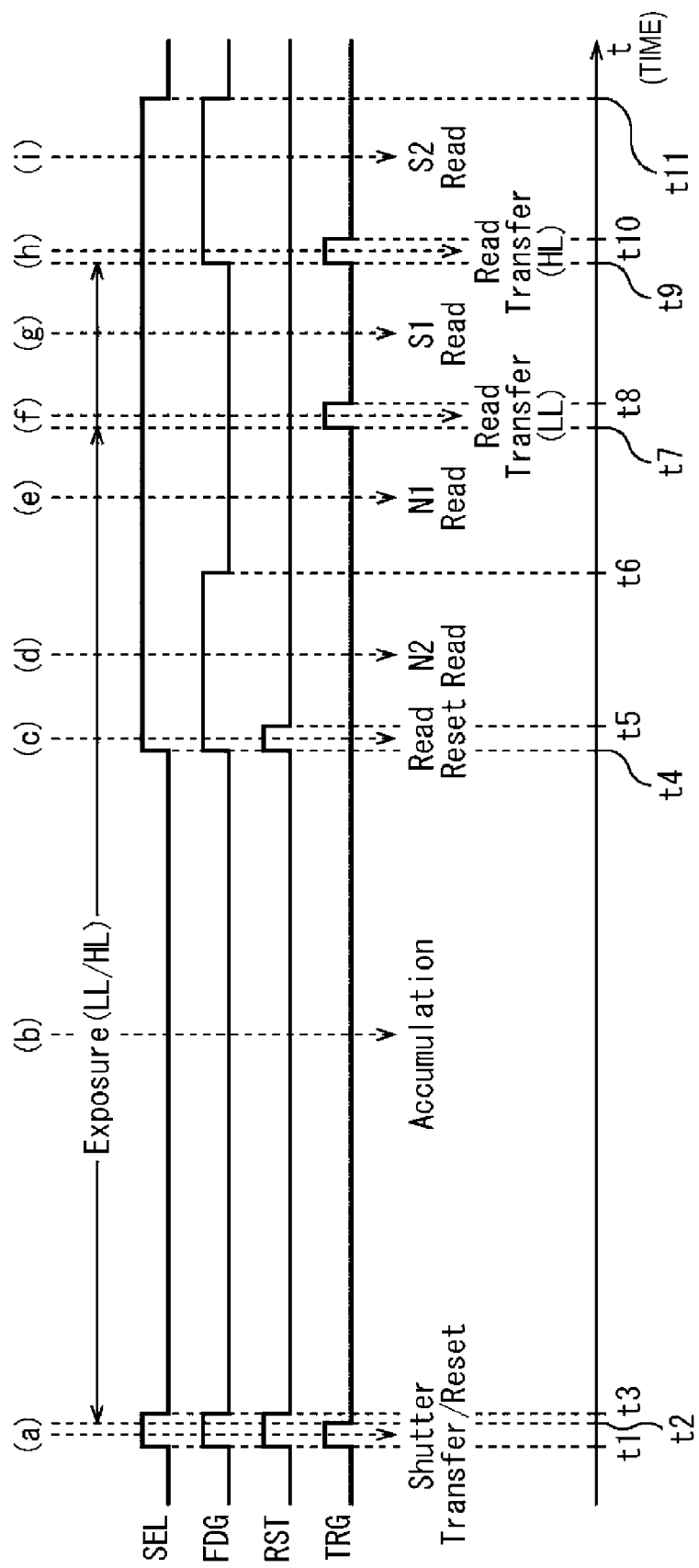
FIG. 6 is a timing chart illustrating an example of the operation of the pixel of FIGS. 4 and 5.
Figure 7:
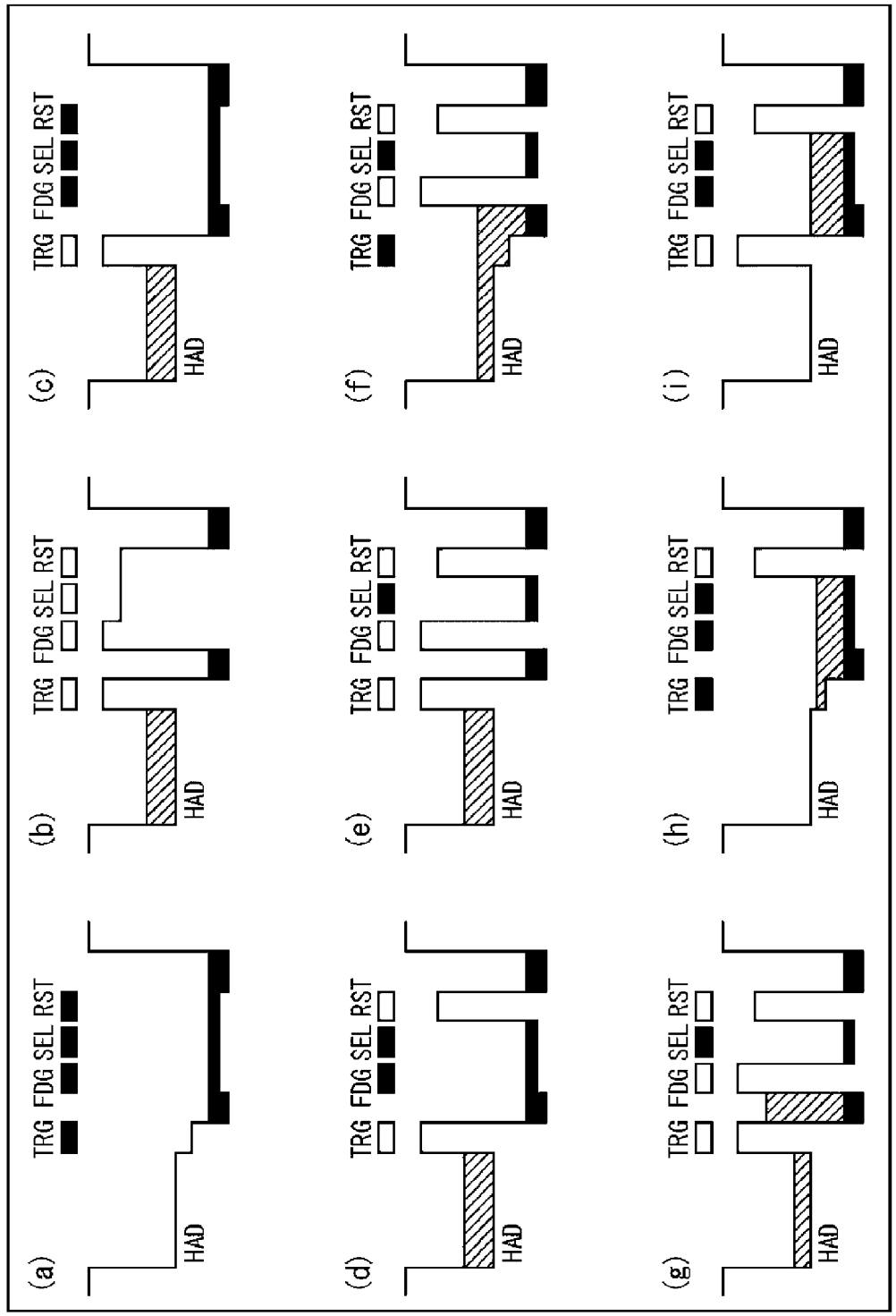
FIG. 7 is a diagram illustrating potential states of a substrate at a predetermined time during the operation of FIG. 6.

FIG. 6 is a timing chart illustrating an example of the operation of the pixel 120 of FIGS. 4 and 5, and FIG. 7 is a diagram illustrating potential states of the substrate 10 at a predetermined time during the operation.

Further, in FIG. 6, the horizontal axis represents time, and the vertical axis represents voltage. In addition, in FIG. 7, the horizontal axis represents the position of the substrate 10 in the horizontal direction, and the vertical axis represents a potential at the position. Further, the potential mentioned in this specification refers to an electrostatic potential of an electron.

As illustrated in FIG. 6, first, during a period from time t1 to time t3, the selection pulse is applied from the vertical drive unit 112 to the gate of the read transistor (SEL) 20 and the gate electrode 123. In other words, the gate of the read transistor 20 and the gate electrode 123 are turned on.

In addition, a transfer pulse is applied from the vertical drive unit 112 to the gate electrode 16 of the connection transistor (FDG) to turn on a transfer transistor (FDC), and a reset pulse is applied to the gate electrode 17 of the reset transistor (RST) to turn on the reset transistor. In addition, during a period from time t1 to time t2 (t1<t2<t3), the transfer pulse is applied from the vertical drive unit 112 to the gate electrode 15 of the transfer transistor (TRG) to turn on the transfer transistor (TRG).

Therefore, as illustrated in FIG. 7, the potential of the region 124 facing the gate electrode 15 is reduced at an arbitrary time (a) within the period from time t1 to time t2. In addition, the potential of the second charge voltage conversion section 121 facing the gate electrode 16, the gate electrode 123, and the gate electrode 17 is reduced. As a result, the charges accumulated in the photoelectric conversion element 11, the first charge voltage conversion section 12, and the second charge voltage conversion section 121 are drained (reset).

Next, as illustrated in FIG. 6, in a period from time t3 to time t4 (t3<t4), no pulses are applied from the vertical drive unit 112. Therefore, as illustrated in FIG. 7, the potentials of the first charge voltage conversion section 12 and the n-type layer 122 remain low at an arbitrary time (b) within the period from time t3 to time t4, but the potentials of the region 124 and the second charge voltage conversion section 121 are increased. As a result, the charges generated by photoelectric conversion are accumulated in the photoelectric conversion element 11. In other words, the exposure is performed.

Then, as illustrated in FIG. 6, in a period from time t4 to time t11 (t4<t11), the selection pulse is applied to the read transistor 20 and the gate electrode 123. In addition, in a period from time t4 to time t6 (t4<t6<t11), the transfer pulse is applied to the gate electrode 16. In addition, in a period from time t4 to time t5 (t4<t5<t6), the reset pulse is applied to the gate electrode 123.

Therefore, as illustrated in FIG. 7, the potential of the region 124 remains high at an arbitrary time (c) within the period from time t4 to time t5, but the potentials of the first charge voltage conversion section 12 and the second charge voltage conversion section 121 are reduced.

At this time, the selection pulse is applied to the gate of the read transistor 20. For this reason, a voltage corresponding to the charges at the time of resetting the connection transistor (FDG), the MOS capacitor, and the reset transistor (RST) is amplified by the amplification transistor 19, and is output as the pixel signal to the vertical signal line 117 via the read transistor 20.

As described above, at time (c), the pixel signal at the time of resetting the connection transistor (FDG), the MOS capacitor, and the reset transistor (RST) is output to the vertical signal line 117. The pixel signal is used in the CDS process and the like.

In addition, as illustrated in FIG. 7, in the second charge voltage conversion section 121, only the potential of the region facing the gate electrode 17 is increased at an arbitrary time (d) within a period from time t5 to time t6. In addition, at this time, the selection pulse is applied to the gate of the read transistor 20.

For this reason, a voltage corresponding to the charges at the time of resetting the connection transistor (FDG) and the MOS capacitor is amplified by the amplification transistor 19, and is output as the pixel signal to the vertical signal line 117 by the read transistor 20. As described above, at time (d), the pixel signal at the time of resetting the connection transistor (FDG) and the MOS capacitor is output to the vertical signal line 117. The pixel signal is used in the CDS process and the like.

Furthermore, at an arbitrary time (e) within a period from time t6 to time t7 (t6<t7<t11) when the transfer pulse is applied to the gate electrode 15, as illustrated in FIG. 7, the potential of the second charge voltage conversion section 121 facing the gate electrode 16 as well as the gate electrode 17 is increased. In addition, at this time, the selection pulse is applied to the gate of the read transistor 20.

For this reason, a voltage corresponding to the charges at the time of resetting the first charge voltage conversion section 12 is amplified by the amplification transistor 19, and is output as the pixel signal to the vertical signal line 117 by the read transistor 20. As described above, at time (e), the pixel signal at the time of resetting the first charge voltage conversion section 12 is output to the vertical signal line 117. The pixel signal is used in the CDS process and the like.

Next, as illustrated in FIG. 6, in a period from time t7 to time t8 (t7<t8<t11), the transfer pulse is applied to the transfer transistor (TRG). Therefore, as illustrated in FIG. 7, the potential of the region 124 is reduced at an arbitrary time (f) within the period from time t7 to time t8. Therefore, the charges accumulated in the photoelectric conversion element 11 are transferred to the first charge voltage conversion section 12. In this case, since the capacitance of the first charge voltage conversion section 12 is not sufficiently large, in a case where the amount of charges accumulated in the photoelectric conversion element 11 is large, some of the charges remain in the photoelectric conversion element 11.

Then, as illustrated in FIG. 6, in a period from time t8 to time t9 (t8<t9<t11) when the transfer pulse is applied to the next transfer transistor (TRG), the transfer pulse is not applied to the transfer transistor (TRG). Therefore, as illustrated in FIG. 7, the potential of the region 124 is increased at an arbitrary time (g) within the period from time t8 to time t9. In addition, at this time, the selection pulse is applied to the gate of the read transistor 20.

Therefore, a voltage corresponding to the charges transferred to the first charge voltage conversion section 12 is amplified by the amplification transistor 19, and is output as the pixel signal to the vertical signal line 117 via the read transistor 20. With this configuration, a high-gain pixel signal is read.

Next, as illustrated in FIG. 6, in a period from time t9 to time t11, the transfer pulse is applied to the gate electrode 16. In addition, in a period from time t9 to time t10 (t9<t10<t11), the transfer pulse is applied to the transfer transistor (TRG) again.

Therefore, as illustrated in FIG. 7, the potential of the region 124 is reduced again at an arbitrary time (h) within the period from time t9 to time t10, and also the potential of the region facing the gate electrode 16 of the second charge voltage conversion section 121 is reduced. Therefore, the charges remaining in the photoelectric conversion element 11 are transferred to the first charge voltage conversion section 12 and the second charge voltage conversion section 121.

Then, as illustrated in FIG. 6, in a period from time t10 to time t11, the transfer pulse is not applied to the transfer transistor (TRG). For this reason, as illustrated in FIG. 7, the potential of the region 124 is increased at an arbitrary time (i) within the period from time t10 to time t11. In addition, at this time, the selection pulse and the transfer pulse continues to be applied to the connection transistor (FDG).

Therefore, a voltage corresponding to the charges transferred to the first charge voltage conversion section 12 and the second charge voltage conversion section 121 is amplified by the amplification transistor 19, and is output as the pixel signal to the vertical signal line 117 via the read transistor 20. With this configuration, a low-gain pixel signal is read.

As described above, in the pixel 120, the selection pulse applied to the gate of the read transistor 20 is applied only in the read period from time t4 to time t11 when the pixel signal at the time of the resetting and the actual pixel signal are read. Then, the gate electrode 123 is connected to the gate of the read transistor 20.

Therefore, the voltage applied to the gate electrode 123 becomes an application voltage (for example, the power source voltage) of the transfer pulse in the read period, and becomes a non-application voltage (for example, the voltage at the ground level) of the transfer pulse in the period from time t3 to time t4 other than the read period. In other words, the voltage applied to the gate electrode 123 becomes different in the read period and in the period from time t3 to time t4 other than the read period. Accordingly, it is possible to suppress that a strong electric field is generated in a place on the substrate 10 in the period other than the read period, so that the reliability can be improved. Since the periods such as the exposure period other than the read period are long compared to the read period, the suppression effect is increased.

Figure 8:
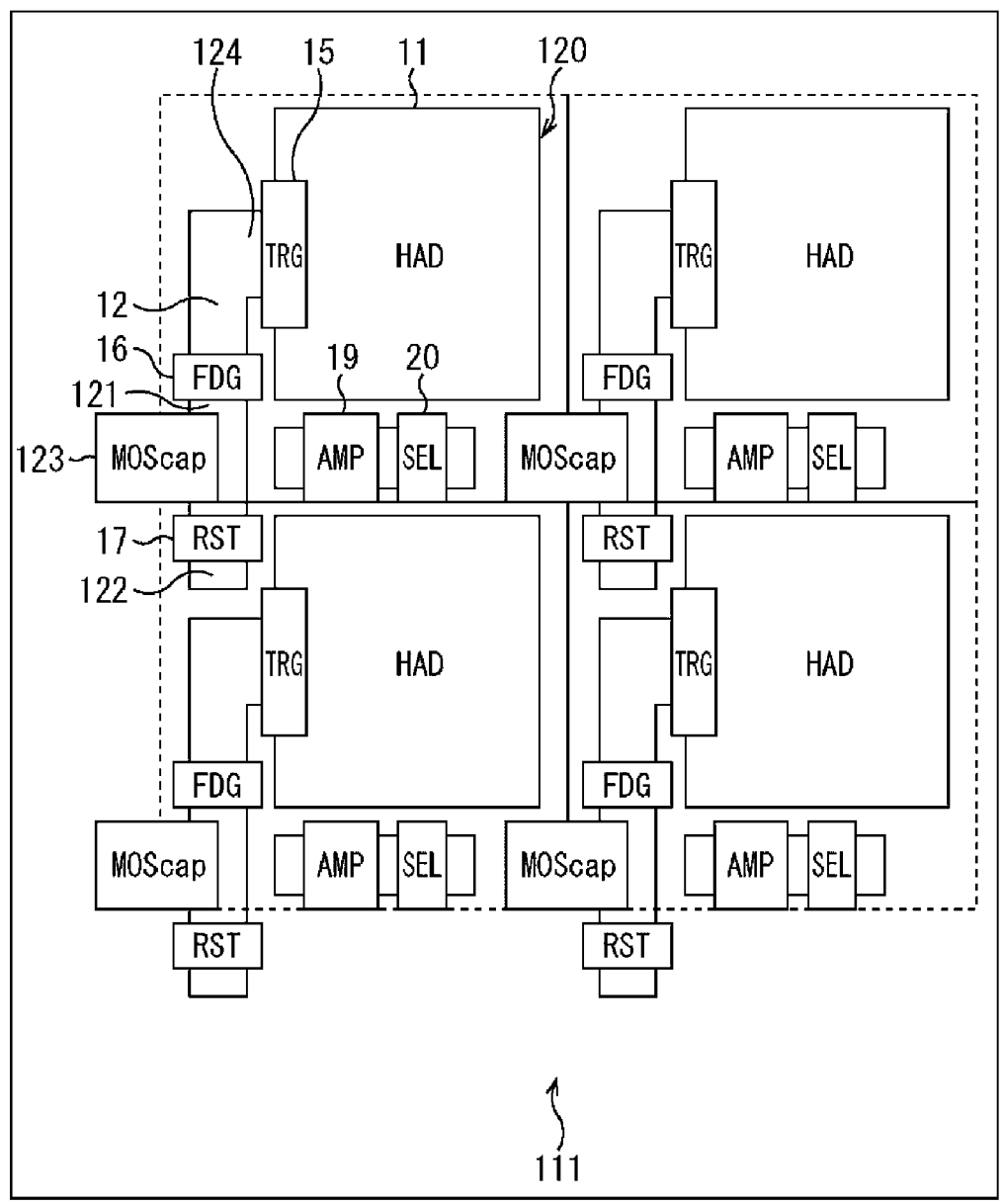
FIG. 8 is a plan view of the pixel array unit illustrating another example of the configuration of the pixel.

(Another Example of Configuration of Pixel)
FIG. 8 is a plan view of the pixel array unit 111 illustrating another example of the configuration of the pixel 120.

The pixel 120 illustrated in FIG. 8 is different in configuration from that of the pixel 120 illustrated in FIG. 4 in that the gate electrode 123 covers a part of the region of the second charge voltage conversion section 121 facing the gate electrode 123.

Specifically, the second charge voltage conversion section 121 and the gate electrode 123 are arranged in a direction perpendicular to the arrangement direction of the gate electrode 16 and the gate electrode 17.

Figure 9:
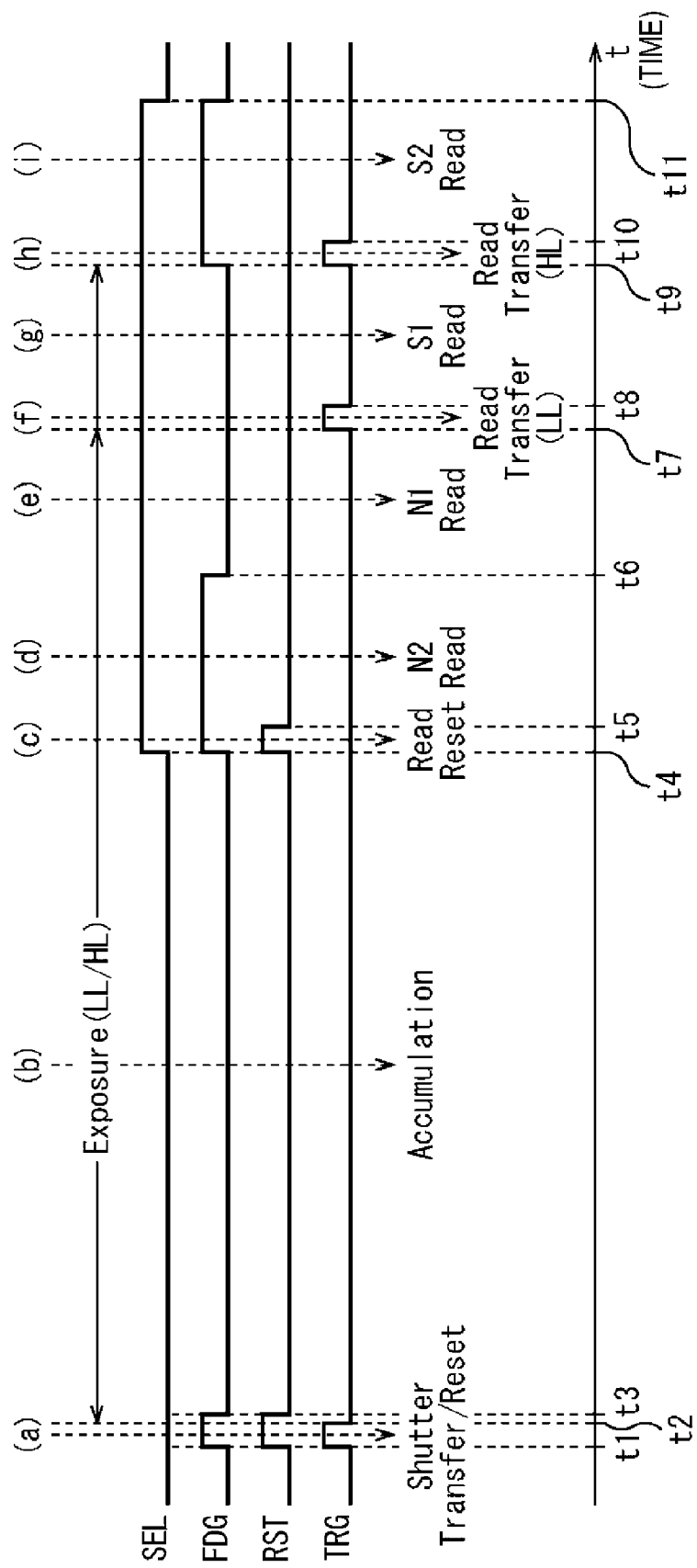
FIG. 9 is a timing chart illustrating the operation of the pixel of FIG. 8.

(Another Example of Operation of Pixel)
FIG. 9 is a timing chart illustrating the operation of the pixel 120 of FIG. 8.

Further, in FIG. 9, the horizontal axis represents time, and the vertical axis represents voltage.

As illustrated in FIG. 9, the operation of the pixel 120 of FIG. 8 is equal to that of FIG. 6 except that the selection pulse is not applied to the gate of the read transistor 20 and the gate electrode 123 in the period from time t1 to time t3.

Therefore, the voltage applied to the gate electrode 123 becomes an application voltage (for example, the power source voltage) of the transfer pulse in the read period, and becomes a non-application voltage (for example, the voltage at the ground level) of the transfer pulse in the period other than the read period. In other words, the voltage applied to the gate electrode 123 becomes different in the read period and in the period other than the read period. Accordingly, it is possible to suppress that a strong electric field is generated in a place on the substrate 10 in the period other than the read period, so that the reliability can be improved.

<Second Embodiment>
Example of Configuration of Solid-State Image Pickup Device According to Second Embodiment The configuration according to a second embodiment of the CMOS image sensor as the solid-state image pickup device to which the present disclosure is applied is equal to that of the CMOS image sensor 100 illustrated in FIG. 3 except the pixel of the pixel array unit 111. Therefore, only the pixel will be described.

Figure 10:
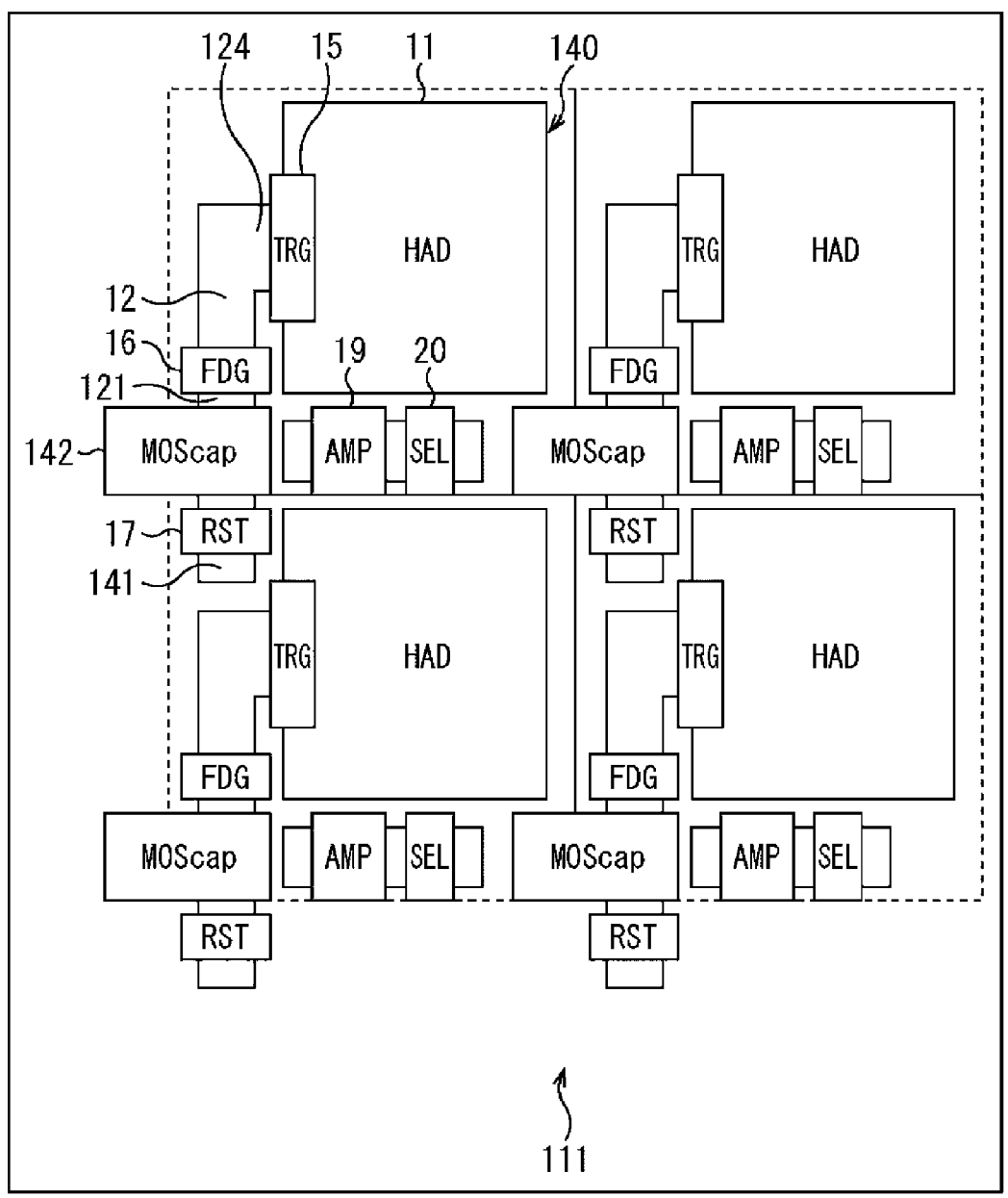
FIG. 10 is a plan view illustrating an example of the configuration of a pixel according to a second embodiment of the CMOS image sensor as the solid-state image pickup device to which the present disclosure is applied.
Figure 11:
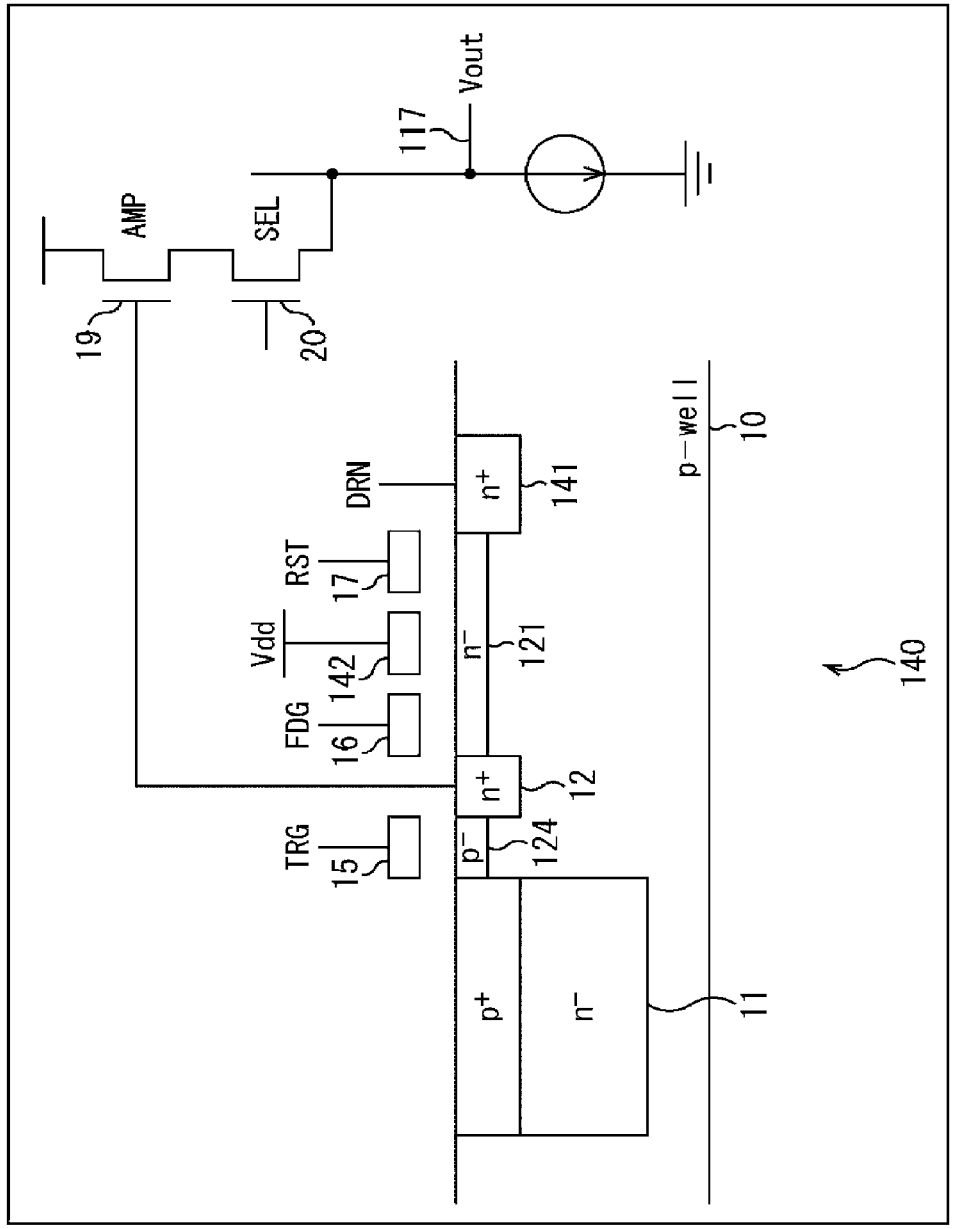
FIG. 11 is a cross-sectional view illustrating the example of the configuration of the pixel according to the second embodiment of the CMOS image sensor as the solid-state image pickup device to which the present disclosure is applied.

FIGS. 10 and 11 are a plan view and a cross-sectional view which illustrate an example of the configuration of a pixel according to the second embodiment of the CMOS image sensor as the solid-state image pickup device to which the present disclosure is applied, respectively.

Among the configurations illustrated in FIGS. 10 and 11, the same configurations as those of FIGS. 4 and 5 are denoted with the same symbols. A redundant description will not be repeated appropriately.

The configuration of a pixel 140 illustrated in FIGS. 10 and 11 is different from that of the pixel 120 illustrated in FIGS. 4 and 5 in that an n-type layer 141 and a gate electrode 142 are provided instead of the n-type layer 122 and the gate electrode 123. In the pixel 140, the electrode of the second charge voltage conversion section 13 in the MOS capacitor varies in voltage.

Specifically, the n-type layer (n+) 141 of the pixel 140 is provided to be adjacent to the second charge voltage conversion section 121 inside the substrate 10. The second charge voltage conversion section 121, the n-type layer 141, and the gate electrode 17 serve as the reset transistor (RST). In other words, the n-type layer 141 serves as the drain of the reset transistor, the gate electrode serves as the gate thereof, and the second charge voltage conversion section 121 serves as the source thereof. A variable voltage (DRN) is applied to the n-type layer 141.

In addition, a gate electrode 142 is provided to completely cover the second charge voltage conversion section 121 between the gate electrode 16 and the gate electrode 17 in the upper portion of the second charge voltage conversion section 121 in the substrate 10, and the power source voltage (Vdd) is applied to the gate electrode 142.

The gate electrode 142 and the region of the second charge voltage conversion section 121 facing the gate electrode 142 serve as the MOS capacitor. In other words, the gate electrode 142 is the gate electrode of the MOS capacitor, and the region of the second charge voltage conversion section 121 facing the gate electrode 142 is the substrate electrode of the MOS capacitor. Therefore, the substrate electrode of the MOS capacitor is connected to the source of the reset transistor.

With the configuration described above, in the pixel 140, similarly to the pixel 120, since no gate electrodes are connected to the region facing the gate electrode 142 of the second charge voltage conversion section 121, and there is no need to provide the contact region, the pixel 140 has a high area efficiency compared to the pixel 1. Accordingly, it is possible to improve the fill factor.

Figure 12:
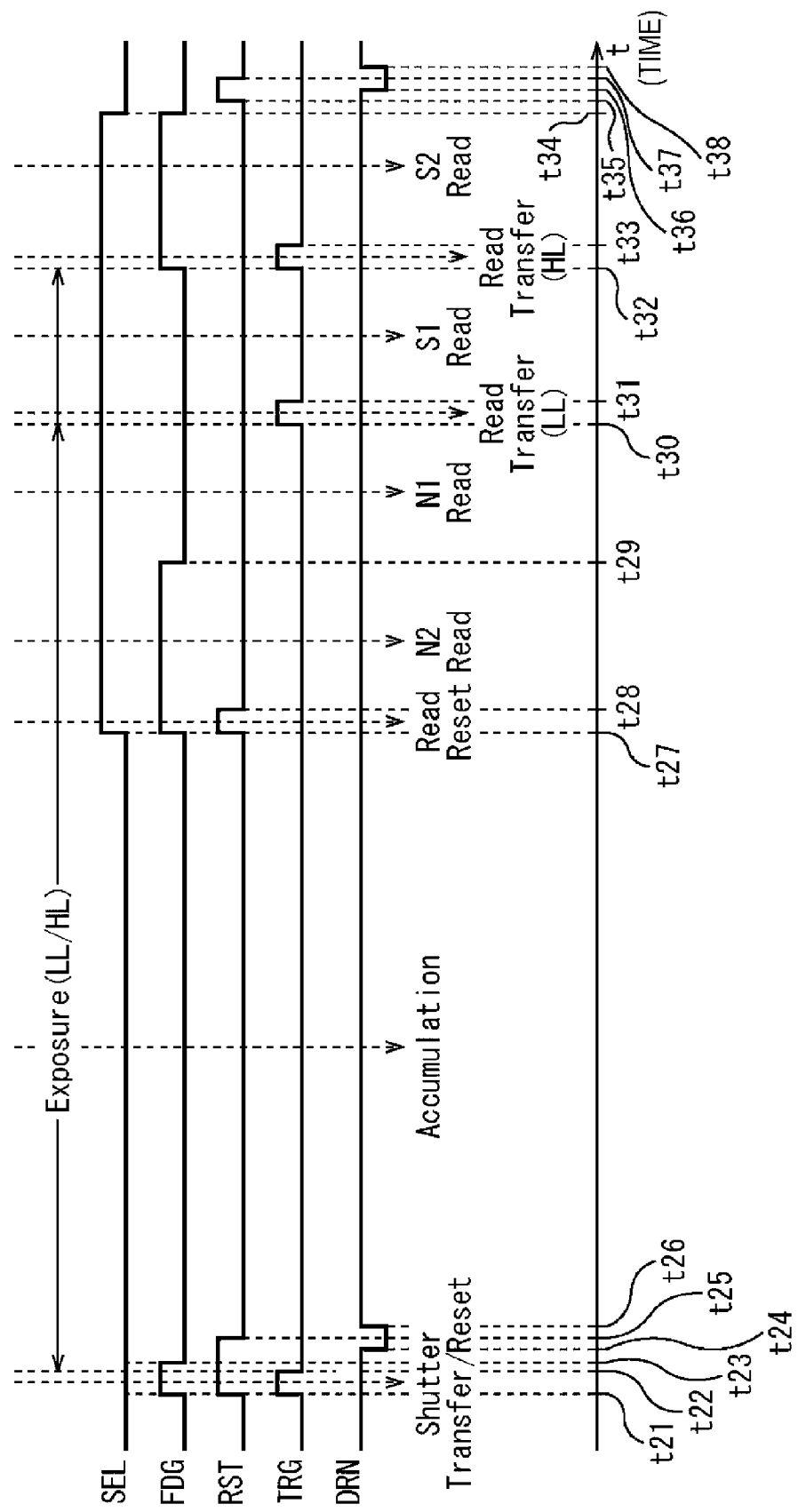
FIG. 12 is a timing chart illustrating an example of the operation of the pixel.

(Example of Operation of Pixel)
FIG. 12 is a timing chart illustrating an example of the operation of the pixel 140.

Further, in FIG. 12, the horizontal axis represents time, and the vertical axis represents voltage.

As illustrated in FIG. 12, first, in a period from time t21 to time t23 (t21<t23), the transfer pulse is applied to the gate electrode 16 of the connection transistor (FDG). In addition, in a period from time t21 to time t25 (t23<t25), the reset pulse is applied to the gate electrode 17 of the reset transistor (RST). In addition, in a period from time t21 to time t22 (t21<t22<t23), the transfer pulse is applied to the gate electrode 15 of the transfer transistor (TRG).

Therefore, in the period from time t21 to time t22, similarly to the case of time (a) illustrated in FIG. 7, the potentials of the region 124 and the second charge voltage conversion section 121 are reduced. As a result, the charges accumulated in the photoelectric conversion element 11, the first charge voltage conversion section 12, and the second charge voltage conversion section 121 are drained (reset).

Then, since the transfer pulse is not applied to the transfer transistor (TRG) at time t22, the potential of the region 124 is increased, and the charges start to be accumulated by the photoelectric conversion element 11. In other words, the exposure starts.

Next, as illustrated in FIG. 12, in a period from time t24 (t23<t24<t25) to time t26 (t25<t26), a pulse reversed in phase (hereinafter, referred to as a reversed-phase pulse) compared to the other pulses is applied to the n-type layer 141. In other words, in the period from time t24 to time t26, the voltage applied to the n-type layer 141 becomes a low voltage. In addition, at this time, the reset pulse is applied up to time t25.

Therefore, in a period from time t24 to time t25, the region of the second charge voltage conversion section 121 facing the gate electrode 142, that is, a depletion layer of the substrate electrode of the MOS capacitor is filled back, so that a strong electric field is suppressed from being generated in a place on the substrate 10.

The operations in a period from time t27 to time t34 are equal to those in the period from time t4 to time t11 illustrated in FIG. 6, and the descriptions thereof will not be presented.

After time t34, the reset pulse is applied in a period from time t35 (t34<t35) to time t37 (t35<t37). In addition, in a period from time t36 (t35<t36<t37) to time t38 (t37<t38), the reversed-phase pulse is applied to the n-type layer 141. With this configuration, in a period from time t36 to time t37, the depletion layer of the substrate electrode of the MOS capacitor is filled back again, so that a strong electric field is suppressed from being generated in a place on the substrate 10.

As described above, in the pixel 140, in the period from time t24 to time t26 and the period from time t36 to time t38 other than the read period, the reversed-phase pulse is applied to the substrate electrode of the MOS capacitor via the reset transistor. In addition, the reversed-phase pulse is not applied in a period including the read period other than the above-mentioned periods.

Therefore, the voltage applied to the substrate electrode of the MOS capacitor via the reset transistor becomes a low voltage in periods other than the read period, and becomes a high voltage (for example, the power source voltage) in a period including the read period other than the periods. In other words, the voltage applied to the substrate electrode of the MOS capacitor via the reset transistor becomes different in periods other than the read period and in a period including the read period other than the periods. Accordingly, it is possible to suppress that a strong electric field is generated in a place on the substrate 10 in the periods other than the read period, so that the reliability can be improved.

(Another Example of Configuration of Pixel)

Figure 13:
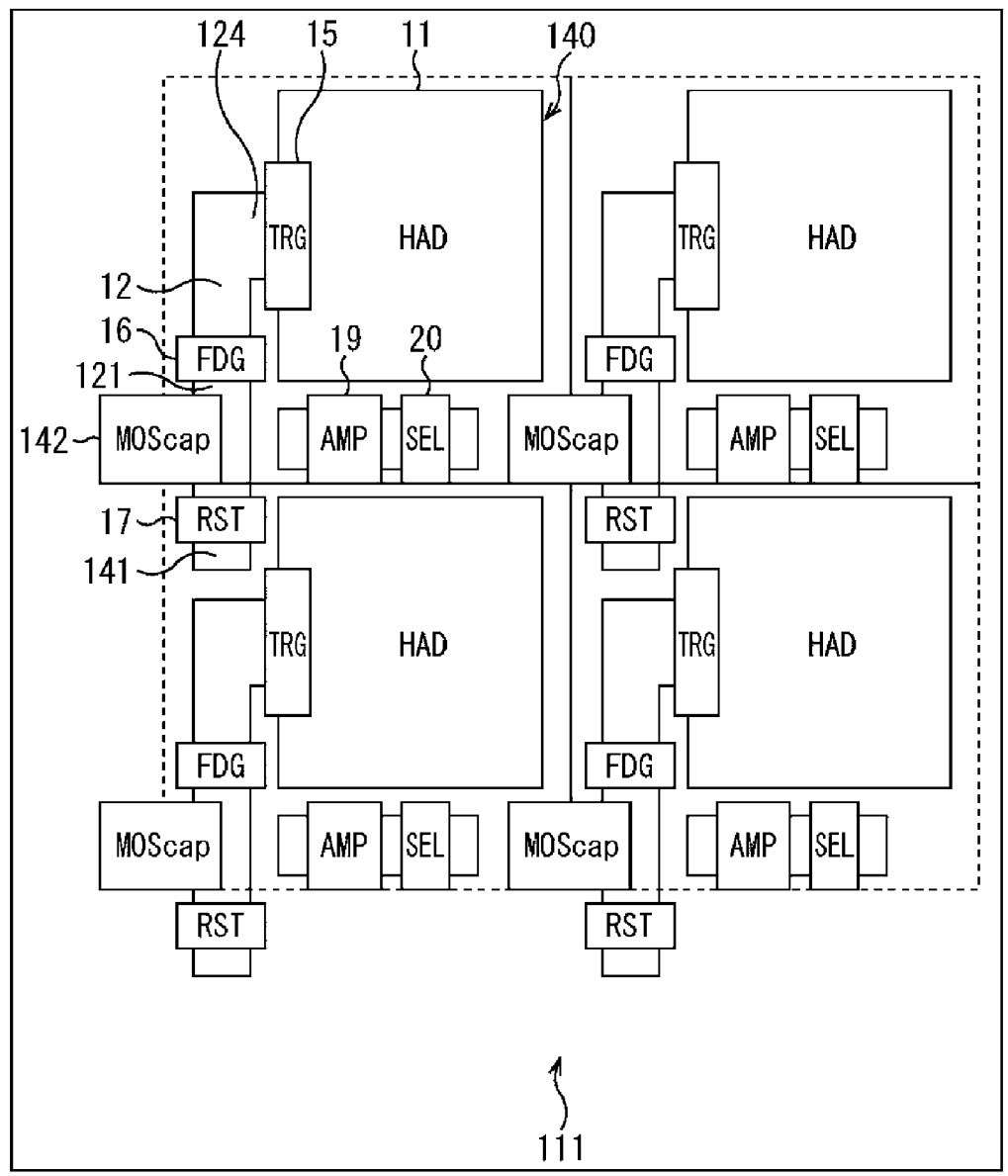
FIG. 13 is a plan view illustrating another example of the configuration of the pixel.

FIG. 13 is a plan view illustrating another example of the configuration of the pixel 140.

The pixel 140 illustrated in FIG. 13 is different in configuration from that of the pixel 140 illustrated in FIG. 10 in that the gate electrode 142 covers a part of the second charge voltage conversion section 121.

Specifically, the second charge voltage conversion section 121 and the gate electrode 142 are arranged in a direction perpendicular to the arrangement direction of the gate electrode 16 and the gate electrode 17.

The operation of the pixel 140 illustrated in FIG. 13 is equal to that of the pixel 140 illustrated in FIG. 10, and the description thereof will not be presented.

<Example of Configuration According to Third Embodiment>

Example of Configuration of Electronic Apparatus according to Embodiment

Figure 14:
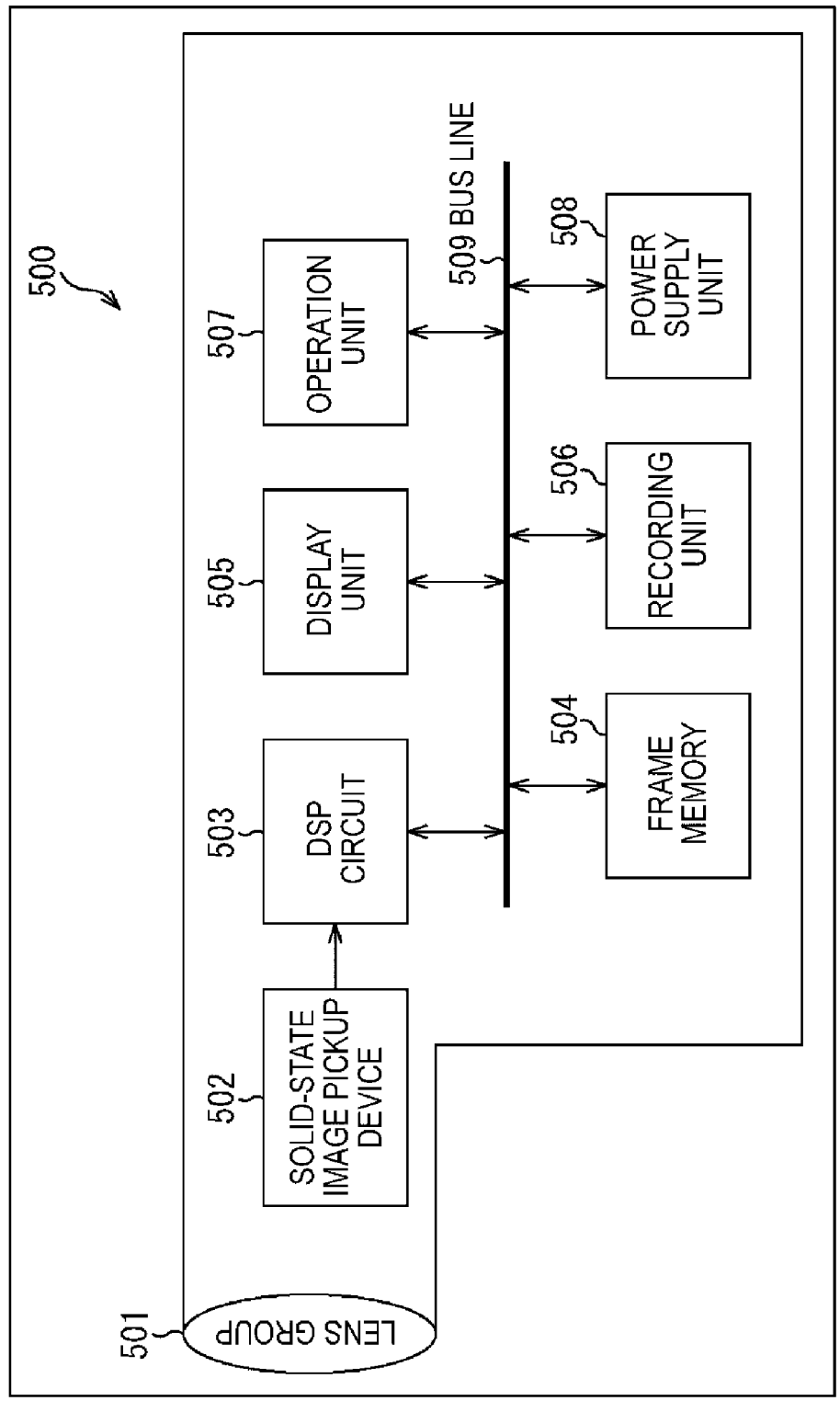
FIG. 14 is a block diagram illustrating an example of the configuration of an image pickup apparatus as an electronic apparatus to which the present disclosure is applied.

FIG. 14 is a block diagram illustrating an example of the configuration of an image pickup apparatus as an electronic apparatus to which the present disclosure is applied.

An image pickup apparatus 500 illustrated in FIG. 14 is a video camera, a digital still camera, or the like. The image pickup apparatus 500 is configured by an optical system 501, a solid-state image pickup device 502, a DSP circuit 503, a frame memory 504, a display unit 505, a recording unit 506, an operation unit 507, and a power supply unit 508. The DSP circuit 503, the frame memory 504, the display unit 505, the recording unit 506, the operation unit 507, and the power supply unit 508 are connected to one another via a bus line 509.

The optical system 501 is configured by a group of lenses and the like, and forms an image on an image pickup face of the solid-state image pickup device 502 by capturing the incident light (image light) from an object. The solid-state image pickup device 502 is configured by the CMOS image sensors according to the above-mentioned first and second embodiments. The solid-state image pickup device 502 converts the light quantity of incident light which is formed as an image on the image pickup face by the optical system 501 into electric signals in units of pixels, and supplies the electric signals as the pixel signals to the DSP circuit 503.

The DSP circuit 503 performs a predetermined image processing on the pixel signals which are supplied from the solid-state image pickup device 502, and supplies the processed image signals to the frame memory 504 in units of frames for temporal storage.

The display unit 505, for example, is configured by a panel display device such as a liquid-crystal panel or an organic electro luminescence (EL) panel, and displays an image based on the pixel signals which are temporarily stored in the frame memory 504 in units of frames.

The recording unit 506 is configured by a digital versatile disk (DVD), a flash memory, and the like, and reads and records the pixel signals which are temporarily stored in the frame memory 504 in units of frames.

The operation unit 507 issues, in accordance with a user operation, operation instructions for various functions that the image pickup apparatus 500 has. The power supply unit 508 appropriately supplies power to the DSP circuit 503, the frame memory 504, the display unit 505, the recording unit 506, and the operation unit 507.

The electronic apparatus to which the present technology is applied may include an electronic apparatus which uses the solid-state image pickup device as an image capturing unit (photoelectric conversion unit). Besides the image pickup apparatus 500, a portable terminal having an imaging function, a copying machine employing the solid-state image pickup device as the image capturing unit, and the like are exemplified.

Further, the CMOS image sensor may be packaged in a type of one chip, or may be in a type of module having an imaging function which is packaged including the optical system and the like.

In addition, embodiments of the present disclosure are not limited to the above-mentioned embodiments, and various changes can be made in a scope not departing from the spirit of the present disclosure.

For example, in the first and second embodiments, an n-type transistor is formed in the p-well layer, but a p-type transistor may be formed in an n-well layer. In this case, magnitude relations in voltages or potentials will be reversed to the case of the first and second embodiments.

Further, the present disclosure may be configured as follows.

(1)

A solid-state image pickup device including:

a photoelectric conversion element that generates charges according to a light quantity of incident light and accumulates the charges in the inside thereof;

a charge transfer section that transfers the charges accumulated by the photoelectric conversion element;

a charge voltage conversion section that converts the charges transferred by the charge transfer section into a voltage; and a MOS capacitor that connects the charge voltage conversion section and a substrate electrode via a transistor, wherein a gate electrode of the MOS capacitor is applied with a voltage that is different in a read period of the voltage signal converted by the charge voltage conversion section and in a period other than the read period.

(2)

The solid-state image pickup device according to (1), further including a read transistor that makes a control of reading the voltage signal converted by the charge voltage conversion section, wherein a gate electrode of the read transistor is connected to the gate electrode of the MOS capacitor.

(3)

The solid-state image pickup device according to (2), wherein the gate electrode of the MOS capacitor is formed to completely cover the substrate electrode of the MOS capacitor.

(4)

The solid-state image pickup device according to (3), further including a reset transistor that resets charges of the charge voltage conversion section, wherein the gate electrode of the MOS capacitor is turned on at the time of resetting the charges of the charge voltage conversion section.

(5)

The solid-state image pickup device according to (2), wherein the gate electrode of the MOS capacitor is formed to cover a part of the substrate electrode of the MOS capacitor.

(6)

The solid-state image pickup device according to (5), further including a reset transistor that resets charges of the charge voltage conversion section, wherein the gate electrode of the MOS capacitor is turned off at the time of resetting the charges of the charge voltage conversion section.

(7)

A driving method of a solid-state image pickup device including a photoelectric conversion element that generates charges according to a light quantity of incident light and accumulates the charges in the inside thereof, a charge transfer section that transfers the charges accumulated by the photoelectric conversion element, a charge voltage conversion section that converts the charges transferred by the charge transfer section into a voltage, and a MOS capacitor that connects the charge voltage conversion section and a substrate electrode via a transistor, the method including:

applying a voltage, which is different in a read period of the voltage signal converted by the charge voltage conversion section and in a period other than the read period, to a gate electrode of the MOS capacitor.

(8)

An electronic apparatus including:

a photoelectric conversion element that generates charges according to a light quantity of incident light and accumulates the charges in the inside thereof;

a charge transfer section that transfers the charges accumulated by the photoelectric conversion element;

a charge voltage conversion section that converts the charges transferred by the charge transfer section into a voltage; and a MOS capacitor that connects the charge voltage conversion section and a substrate electrode via a transistor, wherein a gate electrode of the MOS capacitor is applied with a voltage that is different in a read period of the voltage signal converted by the charge voltage conversion section and in a period other than the read period.

(9)

A solid-state image pickup device including:

a photoelectric conversion element that generates charges according to a light quantity of incident light and accumulates the charges in the inside thereof;

a charge transfer section that transfers the charges accumulated by the photoelectric conversion element;

a charge voltage conversion section that converts the charges transferred by the charge transfer section into a voltage; and a MOS capacitor that connects the charge voltage conversion section and a substrate electrode via a transistor, wherein the substrate electrode of the MOS capacitor is applied with a voltage that is different in a read period of the voltage signal converted by the charge voltage conversion section and in a period other than the read period.

(10)

The solid-state image pickup device according to (9), further including a reset transistor that resets charges of the charge voltage conversion section, wherein a source electrode of the reset transistor is connected to the substrate electrode of the MOS capacitor.

(11)

The solid-state image pickup device according to (10), wherein, when a pulse is applied to a gate electrode of the reset transistor in the period other than the read period, a first voltage is applied to a drain electrode of the reset transistor, and in the read period, a second voltage is applied to the drain electrode of the reset transistor.

(12)

A driving method of a solid-state image pickup device including a photoelectric conversion element that generates charges according to a light quantity of incident light and accumulates the charges in the inside thereof, a charge transfer section that transfers the charges accumulated by the photoelectric conversion element, a charge voltage conversion section that converts the charges transferred by the charge transfer section into a voltage, and a MOS capacitor that connects the charge voltage conversion section and a substrate electrode via a transistor, the method including: applying a voltage, which is different in a read period of the voltage signal converted by the charge voltage conversion section and in a period other than the read period, to the substrate electrode of the MOS capacitor.

(13)

An electronic apparatus including:

a photoelectric conversion element that generates charges according to a light quantity of incident light and accumulates the charges in the inside thereof;

a charge transfer section that transfers the charges accumulated by the photoelectric conversion element;

a charge voltage conversion section that converts the charges transferred by the charge transfer section into a voltage; and a MOS capacitor that connects the charge voltage conversion section and a substrate electrode via a transistor, wherein the substrate electrode of the MOS capacitor is applied with a voltage that is different in a read period of the voltage signal converted by the charge voltage conversion section and in a period other than the read period.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

11 Photoelectric conversion element
12 First charge voltage conversion section
16 Gate electrode
20 Read transistor
100 CMOS image sensor
121 Second charge voltage conversion section
122 n-type layer
123 Gate electrode
124 Region
141 n-type layer
142 Gate electrode

What is claimed is:

1. A solid-state image pickup device comprising:
 a photoelectric conversion element formed in a substrate, wherein the photoelectric conversion element generates charges according to a quantity of incident light, and wherein the charges are accumulated inside the photoelectric conversion element;
 a charge transfer section that transfers the charges accumulated by the photoelectric conversion element, wherein the charge transfer section includes a portion of the substrate having a first charge type;
 a charge voltage conversion section that converts the charges transferred by the charge transfer section into a voltage, wherein the charge voltage conversion section includes a portion of the substrate having a second charge type; and
 a MOS capacitor that connects the charge voltage conversion section and a substrate electrode formed in the substrate via a transistor,
 wherein a gate electrode of the MOS capacitor is applied with a voltage that is different in a read period of the voltage signal converted by the charge voltage conversion section than in a period other than the read period.

2. The solid-state image pickup device according to claim 1, further comprising:
 a read transistor that makes a control of reading the voltage signal converted by the charge voltage conversion section,
 wherein a gate electrode of the read transistor is connected to the gate electrode of the MOS capacitor.

3. The solid-state image pickup device according to claim 2, wherein the gate electrode of the MOS capacitor is formed to completely cover the substrate electrode of the MOS capacitor.

4. The solid-state image pickup device according to claim 3, further comprising:
 a reset transistor that resets charges of the charge voltage conversion section,
 wherein the gate electrode of the MOS capacitor is turned on at the time of resetting the charges of the charge voltage conversion section.

5. The solid-state image pickup device according to claim 2, wherein the gate electrode of the MOS capacitor is formed to cover a part of the substrate electrode of the MOS capacitor.

6. The solid-state image pickup device according to claim 5, further comprising
 a reset transistor that resets charges of the charge voltage conversion section,
 wherein the gate electrode of the MOS capacitor is turned off at the time of resetting the charges of the charge voltage conversion section.

7. A driving method of a solid-state image pickup device including a photoelectric conversion element formed in a substrate that generates charges according to a quantity of incident light and accumulates the charges in the inside thereof, a charge transfer section that transfers the charges accumulated by the photoelectric conversion element, wherein the charge transfer section includes a portion of the substrate having a first charge type, a charge voltage conversion section that converts the charges transferred by the charge transfer section into a voltage, wherein the charge voltage conversion section includes a portion of the substrate having a second charge type, and a MOS capacitor that connects the charge voltage conversion section and a substrate electrode formed in the substrate via a transistor, the method comprising:
 applying a voltage, which is different in a read period of the voltage signal converted by the charge voltage conversion section than in a period other than the read period, to a gate electrode of the MOS capacitor.

8. An electronic apparatus comprising:
 a photoelectric conversion element formed in a substrate, wherein the photoelectric conversion element generates charges according to a quantity of incident light, and wherein the charges are accumulated inside the photoelectric conversion element;
 a charge transfer section that transfers the charges accumulated by the photoelectric conversion element, wherein the charge transfer section includes a portion of the substrate having a first charge type;
 a charge voltage conversion section that converts the charges transferred by the charge transfer section into a voltage, wherein the charge voltage conversion section includes a portion of the substrate having a second charge type; and a MOS capacitor that connects the charge voltage conversion section and a substrate electrode formed in the substrate via a transistor, wherein a gate electrode of the MOS capacitor is applied with a voltage that is different in a read period of the voltage signal converted by the charge voltage conversion section than in a period other than the read period.

9. A solid-state image pickup device comprising:

a photoelectric conversion element that generates charges according to a light quantity of incident light and accumulates the charges in the inside thereof;

a charge transfer section that transfers the charges accumulated by the photoelectric conversion element;

a charge voltage conversion section that converts the charges transferred by the charge transfer section into a voltage; and a MOS capacitor that connects the charge voltage conversion section and a substrate electrode via a transistor, wherein the substrate electrode of the MOS capacitor is applied with a voltage that is different in a read period of the voltage signal converted by the charge voltage conversion section and in a period other than the read period.

10. The solid-state image pickup device according to claim 9, further comprising a reset transistor that resets charges of the charge voltage conversion section, wherein a source electrode of the reset transistor is connected to the substrate electrode of the MOS capacitor.

11. The solid-state image pickup device according to claim 10, wherein, when a pulse is applied to a gate electrode of the reset transistor in the period other than the read period, a first voltage is applied to a drain electrode of the reset transistor, and in the read period, a second voltage is applied to the drain electrode of the reset transistor.

12. A driving method of a solid-state image pickup device including a photoelectric conversion element formed in a substrate that generates charges according to a quantity of incident light and accumulates the charges in the inside thereof, a charge transfer section that transfers the charges accumulated by the photoelectric conversion element, wherein the charge transfer section includes a portion of the substrate having a first charge type, a charge voltage conversion section that converts the charges transferred by the charge transfer section into a voltage, wherein the charge voltage conversion section includes a portion of the substrate having a second charge type, and a MOS capacitor that connects the charge voltage conversion section and a substrate electrode formed in the substrate via a transistor, the method comprising:

applying a voltage, which is different in a read period of the voltage signal converted by the charge voltage conversion section than in a period other than the read period, to the substrate electrode of the MOS capacitor.

13. An electronic apparatus comprising:

a photoelectric conversion element formed in a substrate, wherein the photoelectric conversion element generates charges according to a quantity of incident light, and wherein the charges are accumulated inside the photoelectric conversion element;

a charge transfer section that transfers the charges accumulated by the photoelectric conversion element, wherein the charge transfer section includes a portion of the substrate having a first charge type;

a charge voltage conversion section that converts the charges transferred by the charge transfer section into a voltage, wherein the charge voltage conversion section includes a portion of the substrate having a second charge type; and a MOS capacitor that connects the charge voltage conversion section and a substrate electrode formed in the substrate via a transistor, wherein the substrate electrode of the MOS capacitor is applied with a voltage that is different in a read period of the voltage signal converted by the charge voltage conversion section than in a period other than the read period.

14. The solid-state image pickup device according to claim 1, wherein the first charge type is a p-type, and wherein the second charge type is an n-type.

* * * * *